(12) United States Patent
Meersman et al.

(10) Patent No.: US 7,972,032 B2
(45) Date of Patent: Jul. 5, 2011

(54) LED ASSEMBLY

(75) Inventors: Karim Meersman, Kortemark (BE); Bruno Devos, Zulte (BE); Peter Gerets, Roeselare (BE); Katrien Noyelle, Gullegem (BE)

(73) Assignee: Barco N.V., Kortrijk (BE)

( * ) Notice: Subject to any disclaimer, the term of this patent is extended or adjusted under 35 U.S.C. 154(b) by 64 days.

(21) Appl. No.: 12/222,975

(22) Filed: Aug. 21, 2008

(65) Prior Publication Data

US 2009/0059587 A1 Mar. 5, 2009

(30) Foreign Application Priority Data

Aug. 21, 2007 (GB) .................................. 0716230.8

(51) Int. Cl.
*F21S 4/00* (2006.01)

(52) U.S. Cl. ............... 362/249.02; 362/237; 362/311.15

(58) Field of Classification Search ............ 362/237, 362/244, 245, 248, 249.02, 255, 311.02, 362/311.04, 311.15, 328, 800; 257/98, 99, 100

See application file for complete search history.

(56) References Cited

U.S. PATENT DOCUMENTS

| | | | | |
|---|---|---|---|---|
| 6,082,885 A | * | 7/2000 | Belfer | 362/800 |
| 7,566,155 B2 | * | 7/2009 | Schug et al. | 362/245 |
| 2005/0270791 A1 | * | 12/2005 | Lee | 362/517 |
| 2006/0268556 A1 | * | 11/2006 | Hsieh | 362/347 |

FOREIGN PATENT DOCUMENTS

GB 2329756 A * 3/1999

* cited by examiner

*Primary Examiner* — Y My Quach Lee
(74) *Attorney, Agent, or Firm* — Bacon & Thomas, PLLC

(57) ABSTRACT

The present invention relates to a light emitting device assembly. Such a LED assembly comprises a plurality of lamp-type light emitting devices, each of said lamp-type light emitting devices having a light output side and side walls. The plurality of lamp-type light emitting devices are directly or indirectly connected to each other via said side walls. The latter allows to obtain a compact LED assembly with high brightness.

12 Claims, 5 Drawing Sheets

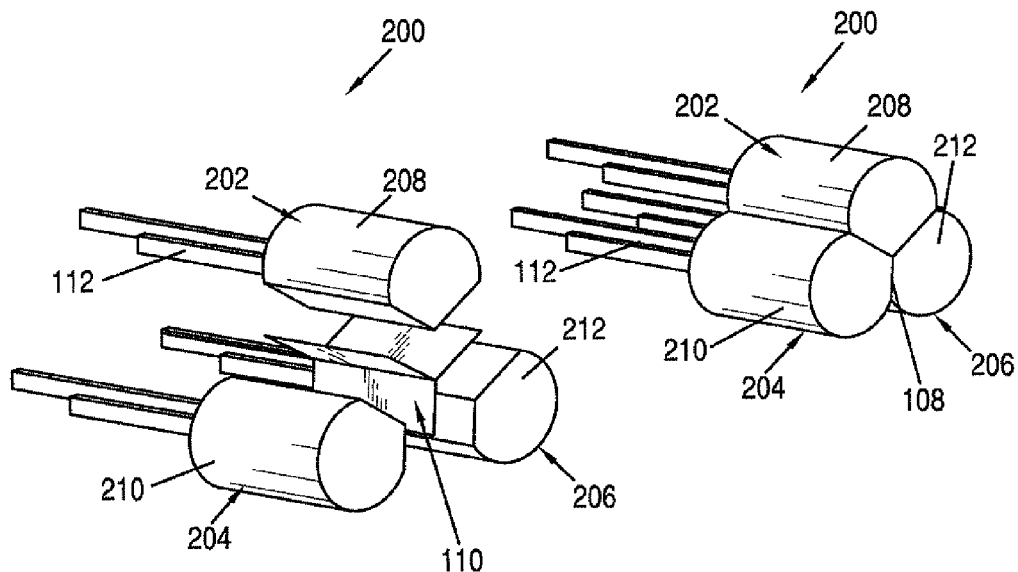
Fig. 3a  Fig. 3b
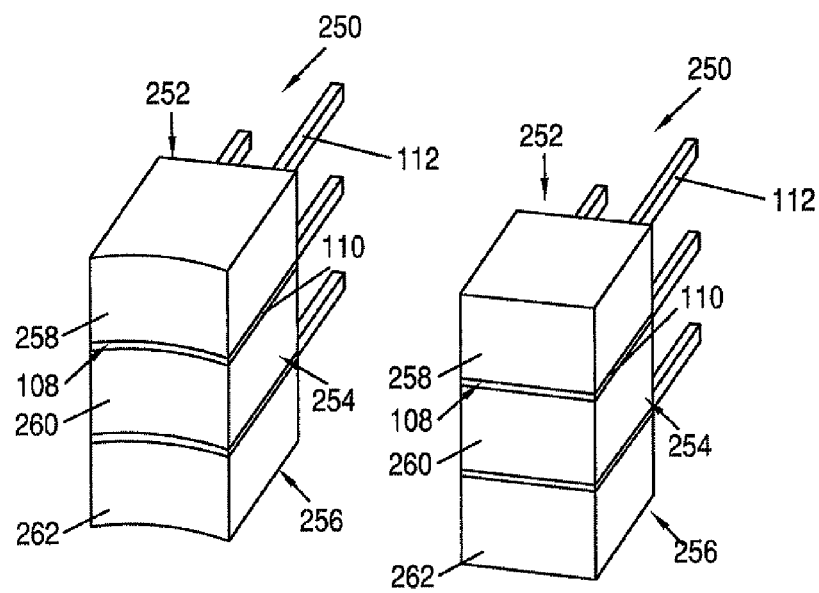
Fig. 4a  Fig. 4b

LED ASSEMBLY

TECHNICAL FIELD OF THE INVENTION

The present invention relates to the field of lighting, projection and displaying. More particularly, the present invention relates to light emitting devices, projectors, displays and lighting systems using such light emitting devices and methods for manufacturing and operating these.

BACKGROUND OF THE INVENTION

Light emitting devices (LEDs), such as for example light emitting diodes, are used in displays for indoor and outdoor use. LED displays thereby aim at combining high light output and high resolution. Combining those properties requires a specific LED type approach. Different LED types exist. Surface mounted device-type (SMD-type) LEDs are LEDs that are mounted directly onto the surface of a printed circuit board. Lamp-type LEDs are LEDs whereby the light emitting device is mounted in a lamp housing.

For high resolution displays, often surface mounted devices (SMD) three-in-one LEDs are used. These LEDs combine three surface-mounted LED dies (RGB) in a polyamide body package. The LEDs are mounted on silverplated leadframes and the package is often closed at the front with an epoxy or silicone optical window. The SMD LEDs are becoming more efficient, but still provide only mediocre performance for outdoor use even when driven at high drive current. Often a white package is used to increase light output, but this yields lower contrast performance. The SMD type LEDs however have a small package size and can be very closely mounted, making it suitable for high resolution displays (3-10 mm pitch) and for delivering a good color compound and viewing angle performance. SMD-type LEDs are not suitable for exposure to environmentally harsh conditions like rain, frost and extreme heath. Leakage or deterioration due to environmental factors often occurs at edges where different materials touch each other, such as at a polyamide/silicone or polyamide/epoxy edge. Using an SMD LED as a light source in outdoor circumstances therefore is less appropriate due to its vulnerability to water-intrusion and failure due to water-leakage.

For high light output applications such as outdoor applications, in general, lamp-type LEDs are used. These LEDs consist of a single material body, normally epoxy material, and hold one LED die, be it red, green or blue, which is mounted on a silver plated lead frame and cup. These LEDs are well known for their efficiency and their resistance to aggressive environmental conditions. The lamp-type LEDs have the advantage of a wide viewing angle and a high brightness.

The lamp-type LEDs have the disadvantage that, since they are single color LEDs, they cannot be mounted very close together, yielding low color compound performance. Seen up close, which often happens e.g. with an indoor system, the LEDs will be seen as separated lightpoints and the colors will not blend together as one pixel.

SUMMARY OF THE INVENTION

It is an object of the present invention to provide good light emitting device assemblies and corresponding apparatus or methods for lighting and/or displaying. It is an advantage of embodiments according to the present invention that LED assemblies are provided that combine both high brightness with good color compound performance. It is an advantage of embodiments according to the present invention that LED assemblies may provide a good viewing angle, e.g. combined with high brightness and good color compound performance. It is an advantage of embodiments according to the present invention that LED assemblies may provide a high contrast, e.g. combined with high brightness and good color compound performance.

The present invention relates to a light emitting device assembly comprising a plurality of lamp-type light emitting devices, each of said lamp-type light emitting devices having an own individual housing comprising a light output side and side walls, the lamp type light emitting devices being positioned adjacent each other wherein the individual housing is adapted in shape so as to be able to position at least one side wall of a light emitting device adjoining to a neighboring device. The plurality of lamp-type light emitting devices thereby may be directly or indirectly connected to each other via said side walls. The light output side may be the viewing side for the lamp-type light emitting device, through which the light to be viewed may be emitted. It is an advantage of embodiments according to the present invention that compact LED assemblies are obtained, e.g. allowing high pitch systems. The latter may be especially advantageous for indoor applications as the visibility of different LEDs can be reduced.

The plurality of light emitting devices may be adapted in shape so as to be able to position at least one side wall of a lamp-type light emitting device of said plurality of lamp-type light emitting devices adjacent or neighboring to part of a side wall or to a full side wall of another lamp-type light emitting device.

Lamp-type light emitting devices are mounted in a lamp housing. Lamp type light emitting devices may consist of a lead frame and a single material body. It is to be noticed that mounting or connection of the lamp-type light emitting devices may be by through-hole mounting as well as via smd mounting.

The side walls of the plurality of light emitting devices may be positioned in direct or indirect contact to each other. Indirect contact thereby may include that there is a solid connection between the side walls, e.g. provided by a layer of glue, a light separation means and another layer of glue. Additional solid elements thus may be provided in between the two side walls.

The plurality of lamp-type emitting devices may be directly or indirectly connected to each other by means of any of glue, nails, screws, engagement means engaging by virtue of their shape, etc.

The plurality of light emitting devices may be shaped and positioned such that a cross-section of the light emitting device assembly comprises a substantially disk-shaped light emitting surface. It is an advantage of embodiments that circular LED assemblies can be obtained.

Each of the plurality of light emitting devices may comprise a cross-section that corresponds with a sector of the disk-shaped light emitting surface.

Each of the plurality of light emitting devices may have a rectangular cross-section.

At least two of the plurality of lamp-type light emitting devices may be connected to each other via a light separation means. The light separation means may be a light blocking means so as to avoid crosstalk between the different light emitting devices in the light emitting device assembly. The light blocking means may be a reflective or absorbing material. The light separation means may be attached by means of any of glue, nails, screws, engagement means engaging by virtue of their shape.

Each of the plurality of lamp-type light emitting devices may have a molded encapsulation material, e.g. the housing of each of the plurality of lamp-type light emitting devices may comprise or consist of molded encapsulation material.

The plurality of lamp-type light emitting devices may be in direct contact to each other.

The present invention relates to a light emitting device assembly comprising a plurality of lamp-type light emitting devices, each of said lamp-type light emitting devices having a light output side and side walls, wherein the plurality of lamp-type light emitting devices are directly or indirectly connected to each other to position the light output sides or surfaces of the lamp-type light emitting devices substantially adjacent or neighboring to each other. Substantially adjacent or neighboring thereby may be such that the spacing between the light output sides or surfaces is smaller than the average diameter of the area of the light output surface of a single lamp-type light emitting device, advantageously smaller than half of the average diameter of the area of the light output surface of a single lamp-type light emitting device, even more advantageously smaller than one fifth of the area of the light output surface of a single lamp-type light emitting device. Substantially adjacent or neighboring also includes that a light separating means may be positioned in between the individual lamp-type LEDs. Dependent features further may be any feature as described above.

The present invention also relates to a display or lighting system that may comprise at least one light emitting device assembly as described above.

The present invention also relates to a method for manufacturing a light emitting device assembly, the method comprising obtaining a plurality of lamp-type light emitting devices, each of them having an own individual housing comprising a light output surface and side walls and adapted in shape so as to be able to position at least one side wall of a light emitting device adjoining to a neighboring device, and positioning the lamp-type light emitting devices adjacent each other. The method may comprise providing a direct or indirect connection between at least one side wall of a first lamp-type light emitting device and at least one side wall of a second lamp-type light emitting device.

Obtaining a plurality of lamp-type light emitting devices may comprise obtaining a plurality of lamp-type light emitting devices being adapted in shape so as to be able to position at least one side wall of a lamp-type light emitting device of said plurality of lamp-type light emitting devices adjacent or neighboring to part of a side wall or to the complete side wall of another lamp-type light emitting device.

The method may comprise connecting the at least one side wall of a first lamp-type light emitting device to a first light separation means and connecting said at least one side wall of a second lamp-type light emitting device to a second side of the light separation means. The separation means may be a light blocking means.

The present invention also relates to a method for manufacturing a display or lighting system, the method comprising obtaining a substrate adapted for supporting a plurality of light emitting device assemblies, providing a plurality of light emitting device assemblies on said substrate, wherein providing a plurality of light emitting device assemblies comprises, for each light emitting device assembly, obtaining a plurality of lamp-type light emitting devices, each of them having an own individual housing comprising a light output surface and side walls and adapted in shape so as to be able to position at least one side wall of a light emitting device adjoining to a neighboring device, and positioning the lamp-type light emitting devices adjacent each other. It further may comprise providing a direct or indirect connection between at least one side wall of a first lamp-type light emitting device and at least one side wall of a second lamp-type light emitting device of said light emitting device assembly.

It is an advantage of embodiments according to the present invention that LED displays can be obtained that are or can be made more easily more watertight. The latter may be obtained without any special sealing mechanics at the front of the display. The LED displays may be especially suitable for outdoor use.

It is an advantage of embodiments according to the present invention that the LED assembly can be easily treated for making them still more protected against environmental elements. The latter is advantageous over two or three material LED bodies, such as e.g. when combining classical epoxy or silicone surface mounted device LEDs, where protection against environmental influence is less or not possible.

Particular and preferred aspects of the invention are set out in the accompanying independent and dependent claims. Features from the dependent claims may be combined with features of the independent claims and with features of other dependent claims as appropriate and not merely as explicitly set out in the claims. The teachings of the present invention permit the design of improved methods and apparatus for displaying appropriate three dimensional images.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 3a and FIG. 3b are an exploded view respectively normal view of an exemplary LED assembly according to an embodiment of the first aspect of the present invention.

FIG. 4a to FIG. 4c are schematic representations of a LED assembly according to a second particular embodiment of the present invention.

Figure 1:
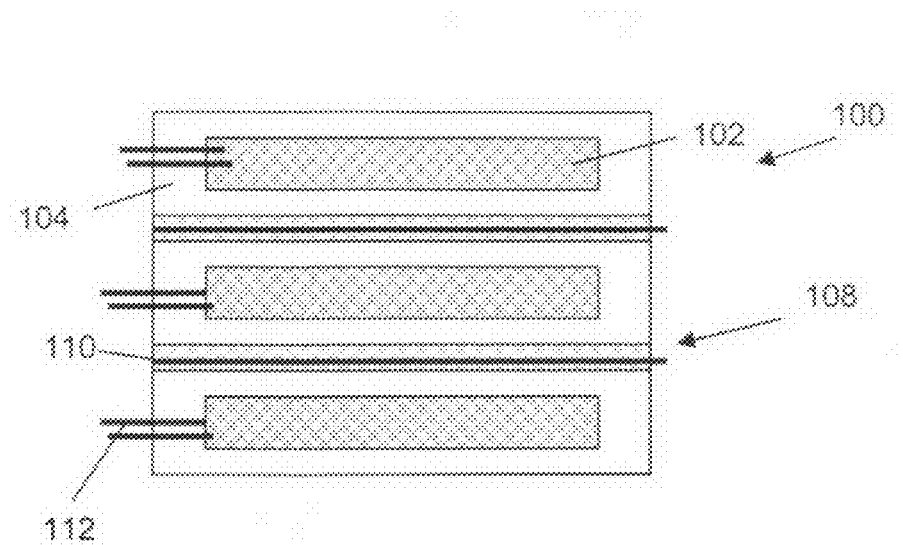
FIG. 1 is a schematic representation of a LED assembly according to embodiments of the first aspect of the present invention.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention. Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein. It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Furthermore, while some embodiments described herein include some but not other features included in other embodiments, combinations of features of different embodiments are meant to be within the scope of the invention, and form different embodiments, as would be understood by those in the art. Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In a first aspect, the present invention relates to a light emitting device (LED) assembly combining a plurality of lamp-type light emitting devices (LEDs), e.g. a plurality of lamp-type light emitting diodes. Each of said lamp-type light emitting devices thereby has an individual housing with a light output side through which light is coupled out in the viewing direction for the LED and side walls. According to embodiments of the present invention the plurality of lamp-type light emitting devices are directly or indirectly connected to each other via said side walls. The plurality of light emitting devices are adapted in shape so as to be able to position a side wall of a first lamp-type light emitting device adjacent or neighboring to another lamp-type light emitting device, e.g. to part of a side wall or to a complete side wall of the other lamp-type light emitting device. A lamp type light emitting device thereby is a light emitting device comprising a leadframe and a single material body. By way of example, the present invention not being limited thereto, a schematic representation of standard and optional components of the light emitting device assembly is shown in FIG. 1. It shows a LED assembly 100 comprising a plurality of lamp-type light emitting devices 102, such as for example light emitting diodes. A lamp-type LED is a light emitting device, e.g. light emitting diode, wherein an individual LED die is positioned in a separate housing having its own light outcoupling surface. It is at itself not surface mounted. In a lamp-type LED, the LED die, which is the element providing the light emission, has its individual housing. The latter is distinct from SMD LEDs wherein three or more LED dies are positioned in a single housing, whereby light of each of the LED dies is coupled out via the same housing. A lamp-type LED thus comprises a LED die mounted with a lamp housing. An encapsulant body 104 made from encapsulation material may be provided and adapted for encapsulating a lamp-type light emitting diode 102 at least part, advantageously completely except for vias, connection paths or connection regions for providing connections for driving and/or powering to the light emitting device. The encapsulant material, may encapsulate the light outcoupling surface of the light emitting device, optionally also large portions or complete sides of the light emitting device and optionally but advantageously also the back-side of the light emitting device. The encapsulant body 104 may be made of any suitable encapsulant material, such as for example but not limited to, epoxy or silicones. Such materials tend not to stick to mould-release components making them especially suitable for molding. Nevertheless other materials and techniques also may be used. The encapsulant material of the encapsulant body may preferably be a single material or single mixture. According to embodiments of the present invention, each light emitting device of the LED assembly may be provided with an encapsulant body. The latter assists in reducing the number of borders or edges between different materials or even avoid borders or edges in the encapsulation material thus resulting in a better encapsulation for a plurality of light emitting devices provided together in the LED assembly. In this way, it assists in making the LED assembly better resistant to environmental parameters, such as e.g. water, wind, or other wear inducing phenomena.

In a particular embodiment, the encapsulation material or mixture may be doped with materials for modifying the optical properties of the encapsulation materials. For example, the encapsulation material may be doped with a saturated color pigment or other feature yielding a very high specular light rejection. The latter may assist in a very high system contrast ratio.

The light emitting devices 102 may emit any type of color emission, such as for example one of a set of primary colors like red, green or blue, emit white, emit another particular color, etc. The number of light emitting devices 102 in the LED assembly may be large only being limited by the physical dimensions of the light emitting devices or the physical dimensions of the LED assembly. The number of the plurality of light emitting devices 102 may be at least two such as e.g. three, four, five, six or more. Particularly advantageous embodiments comprise three lamp-type light emitting devices each emitting one of the three primary colors, each LED assembly thus being able to provide substantially all colors in the visible range and/or to provide white emission when emission of the three lamp-type light emitting devices is combined. In other advantageous embodiments, four lamp-type light emitting devices may be provided, whereby three lamp-type light emitting devices each are used for generating one of three primary colors, such as e.g. red, green and blue, and wherein the fourth light emitting device is redundant and may be a white light emitting device or a light emitting device with a different color, e.g. for expanding the color gamut that may be produced with the LED assembly. In another particular embodiment, the assembly may comprise a red, green, blue, magenta, cyan and yellow lamp-type light emitting device.

According to embodiments of the present invention, the different lamp-type light emitting devices are provided such that there is a direct or indirect connection between side walls of the different light emitting devices. The shape of the different light emitting devices may be adapted so that the lamp-type emitting devices can be positioned adjacent or neighboring to each other. The direct or indirect connection of side walls of the different lamp-type light emitting devices may be any type of connection, such as e.g. via clipping, clicking, gluing, engaging by virtue of their shape, nailing, screwing, etc. In particular embodiments, side walls of the light emitting devices may be glued to each other. The connection thus may be made via a connection means 108 which may be a clipping feature, clicking feature, glue, an engagement means adapted for engaging different light emitting devices by virtue of their shape, nails, screws etc. In a particular embodiment, at least one side wall of a first light emitting device is direct or indirect into contact with a side wall of a second light emitting device. Direct contact may for example be provided by gluing the two light emitting devices directly to each other. Indirect contact may for example be provided by gluing a first light emitting device to a first side of a light separation means 110 and by gluing a second side of a light separation means 110 to a second side of a light separation means, although the invention is not limited thereto.

The particular configuration of the different lamp-type LEDs may be any suitable configuration. Advantageously, the lamp-type LEDs 102 may be arranged such that they form a compact assembly. The plurality of lamp-type light emitting devices 102 may e.g. be positioned so as to form a LED assembly having a cross-section being a disk or disk-like, elliptical, oval, triangular, square, rectangular, pentagonal, hexagonal or any other polygonal shape, etc. or more generally any suitable shape preferred in the applications of the LED assembly. Alternatively or in addition thereto, the LED assembly may have a cross-section such that the light emitting surface of the LED assembly therein has the above specified shape or such that the light outcoupling surface of the LED assembly has the above specified shape. The viewing side or the face of the LED assembly thus may have a variety of shapes.

The light-outcoupling surfaces of the different individual LEDs in the LED assembly, through which the light to be seen is coupled out, may have any suitable shape, such as for example, they may be flat, convex or concave. The light-outcoupling surfaces may be optimized for coupling out the light. The light-outcoupling surfaces may be adapted to have a particular surface finish, such as for example have a gloss or matt surface. The light-outcoupling surfaces furthermore may be adapted with a color film, so as to tune light that is coupled out from the individual light emitting device.

Electrical connections 112 for driving the light emitting devices 102 may be made in any suitable way. For example, the connections for driving the different light emitting devices 102 may be through-hole leads or surface mounted device type leads.

In order to reduce cross-talk between the positioned LEDs, positioned neighboring or adjacent to each other, optionally a light separating means 110 may be provided. The light separating means 110 may e.g. be a light blocking means. The light separating means 110 may be for example a light absorbing means, such as for example a black absorbing material, absorbing light that would fall into a neighboring LED if not absorbed. The light separating means 110 also maybe a reflective means, such as e.g. made of a reflective material, in order to reflect light that would pass to a neighboring LED by reflecting the light back into the LED generating the light. Such absorption or reflection advantageously is high, e.g. higher than 50%, advantageously more than 75%, more advantageously more than 90%, still more advantageously more than 95%. The light separating means 110 may be applied in any suitable way, such as e.g. by applying a coating to one side or both sides of the light emitting devices such as for example painting one or both sides of the light emitting devices, by providing a film in between the light emitting devices, by gluing a material, e.g. as plate or film, in between the light emitting devices, etc. The light separating means 110 may be a single light separating means 110 suitable for separating the light of all individual light emitting devices or different light separating means 110 may be provided to separate the light between a number or each two light emitting devices of the plurality of light emitting devices.

Particular embodiments according to the present invention will further be provided by way of illustration, the present invention not being limited thereto.

Figures 2A, 2B:
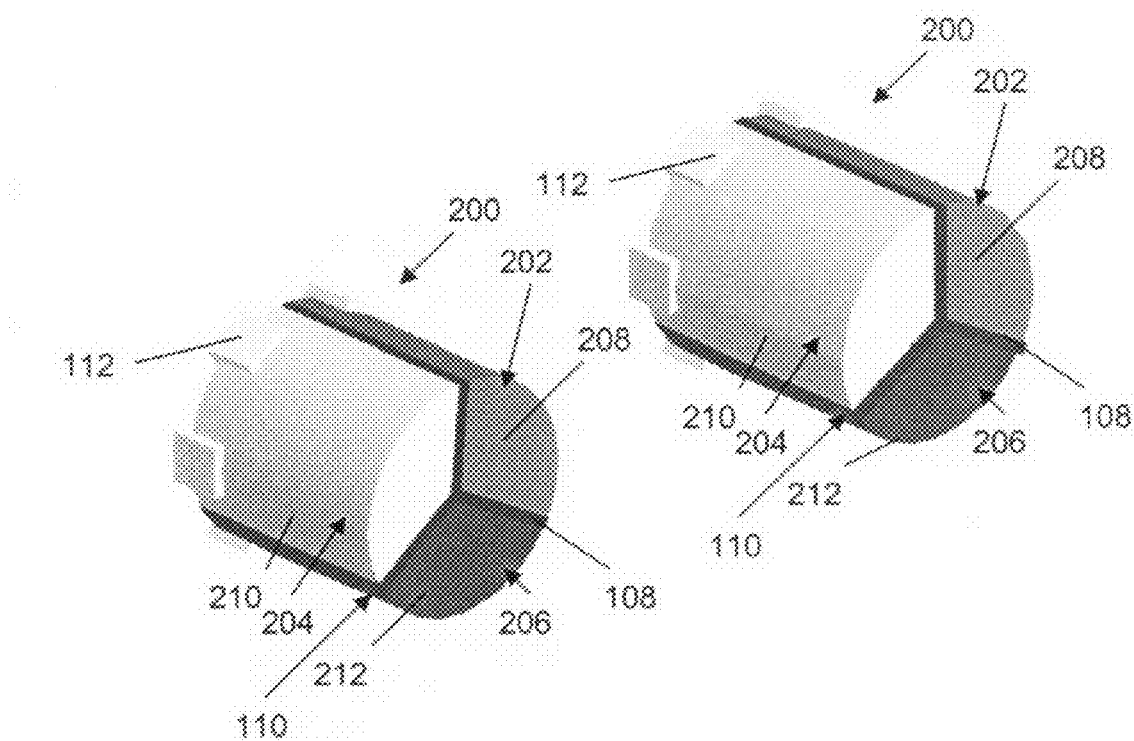
FIG. 2a to FIG. 2e show schematic representations of a LED assembly with disc shape light out coupling surface according to a first particular embodiment of the first aspect of the present invention.
Figure 2C:
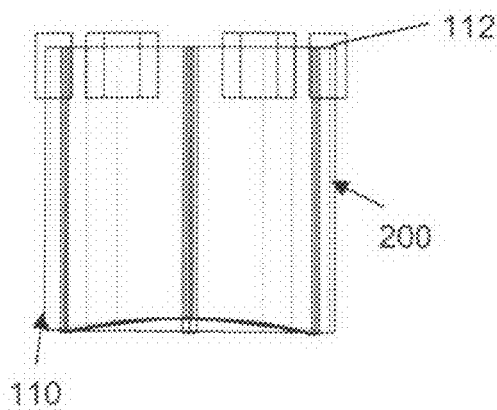
Figure 2D:
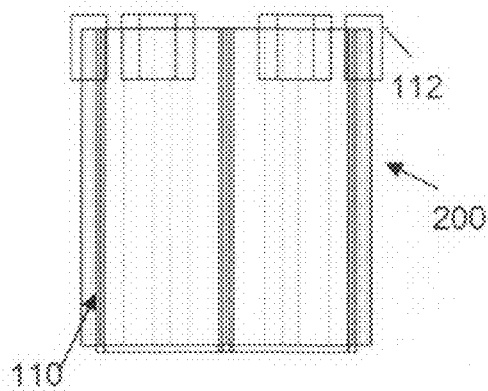
Figure 2E:
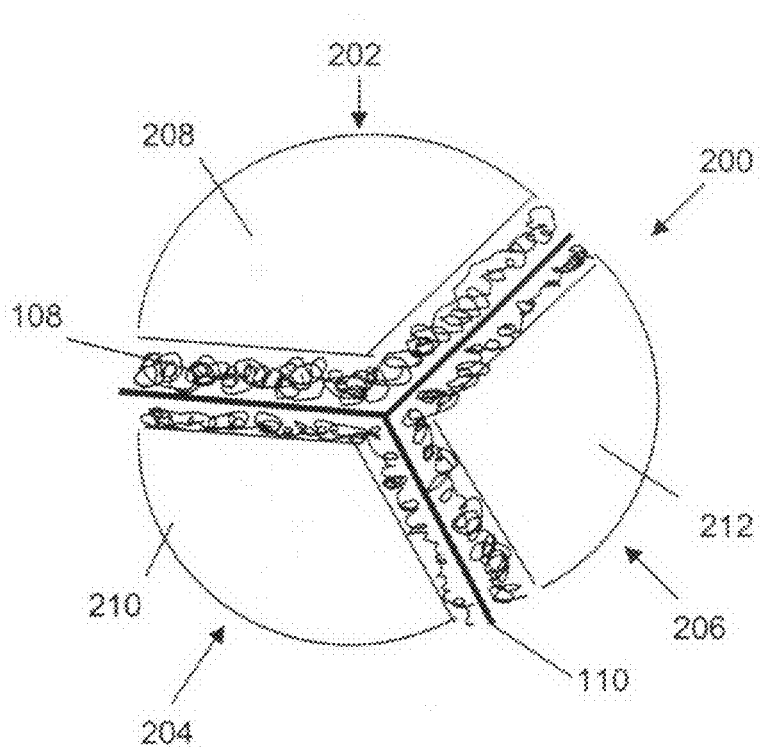

In a first particular embodiment, the present invention relates to a LED assembly as described above, whereby the LED assembly has substantially a disc-like shape. The plurality of individual light emitting devices thereby may have a cross section being sectors of the disc, i.e. pie-shaped portions of a disc with the center of the disc being one corner of the portion. Side walls of the different light emitting devices thereby are in indirect contact with each other via a light separating means. In one example, the LED assembly comprises three light emitting devices, e.g. one red, one green and one blue light emitting device, each being a sector portion of the disc. In advantageous embodiments, the different portions substantially form a full disc when positioned adjacent or neighboring to each other. In one particular example, each of the light emitting devices corresponds with a sector having an area substantially a third of the disc area. Such a configuration may for example be referred to as a delta set-up. An example of a LED assembly 200 according to the present embodiments is shown in FIGS. 2a to 2d, whereby in the present example three lamp-type LEDs 202, 204, 206 are provided each in there encapsulant body 208, 210, 212 and having a cross-section resembling one third of a disc. The three LEDs 202, 204, 206, in the present example corresponding with a red LED, blue LED and green LED, are positioned neighboring or adjacent thus forming a full circular section. The electrical vias 112 are also shown as well as the connection means 108, in the present example being glue, and the light separation means 110. FIG. 2a and FIG. 2b show two views of LED assemblies. In the present example a separation means 110 being a black coating is shown on the inner planes of the different LEDs so as to reduce cross-talk between the LEDs. The light separation means may for example also be a black plastic part (foil or injection molded). The light separation means 110 may be longer than the led package. It may act as a cross talk separator. The present example yields a led assembly 200 that is very compact. The encapsulant bodies or encapsulant material as well as the electrical or data connections may be provided with features and options as described above. In FIG. 2c and FIG. 2d a cross section of such a LED assembly is shown, whereby in FIG. 2c a version is illustrated with a concave shaped surface of the encapsulant bodies. Alternatively, the light outcoupling surface also may be a convex light outcoupling surface. FIG. 2e illustrates an exploded top view of a LED assembly as shown in FIG. 2a to FIG. 2d, wherein 108 illustrates a connection means, in the present example being glue.

In FIG. 3a to FIG. 3b an exploded respectively normal view of an alternative LED assembly configuration is provided wherein the different light emitting devices have not a sector shape but a slightly different shape, i.e. whereby each light emitting device has a cross-section or light outcoupling surface having a double truncated disc shape. Similar as in FIG. 2a and FIG. 2b, the light separating means and connection means also is shown.

Figure 4C:
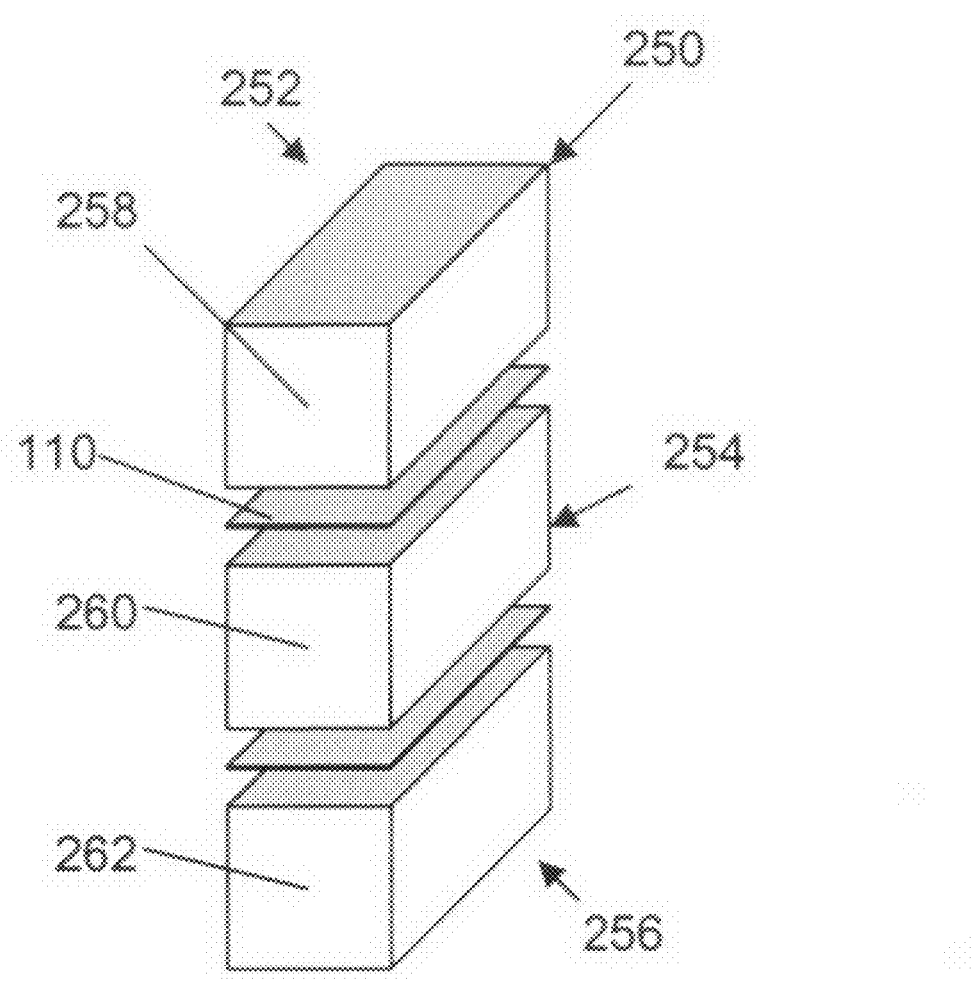

In a second embodiment, a LED assembly as described above is provided, whereby the LED assembly has a substantially square or rectangular shape. More particularly the LED assembly may comprise a cross-section wherein the light emitting surface substantially has a square or rectangular shape. In one particular example the LED assembly comprises three lamp-type light emitting devices, e.g. a red LED, a green LED and a blue LED. In another particular example, more light emitting devices may be present in the LED assembly, making e.g. some of the light emitting devices. These all may have a rectangular shape which may be positioned close or adjacent to each other. The different light emitting devices may be separated by a separating means as described above. The latter assists in reduction of cross-talk between the different lamp-type light emitting devices. The surface of each encapsulant body of the individual LEDs may have any shape or finish, as described above. As an example of the present configuration, e.g. referred to as an in-line setup, a LED assembly 250 with three lamp-type LEDs 252, 254, 256 is shown in FIGS. 4a to 4c. In FIG. 4a a LED assembly with curved light outcoupling surfaces is shown, whereas in FIG. 4b a LED assembly with plane light outcoupling surfaces is shown. The different encapsulant bodies 258, 260, 262 and the electrical vias 112 also are shown, the connection means 108 in the present example is glue. FIG. 4c shows an exploded top view of a setup similar to FIG. 4b.

Figure 5:
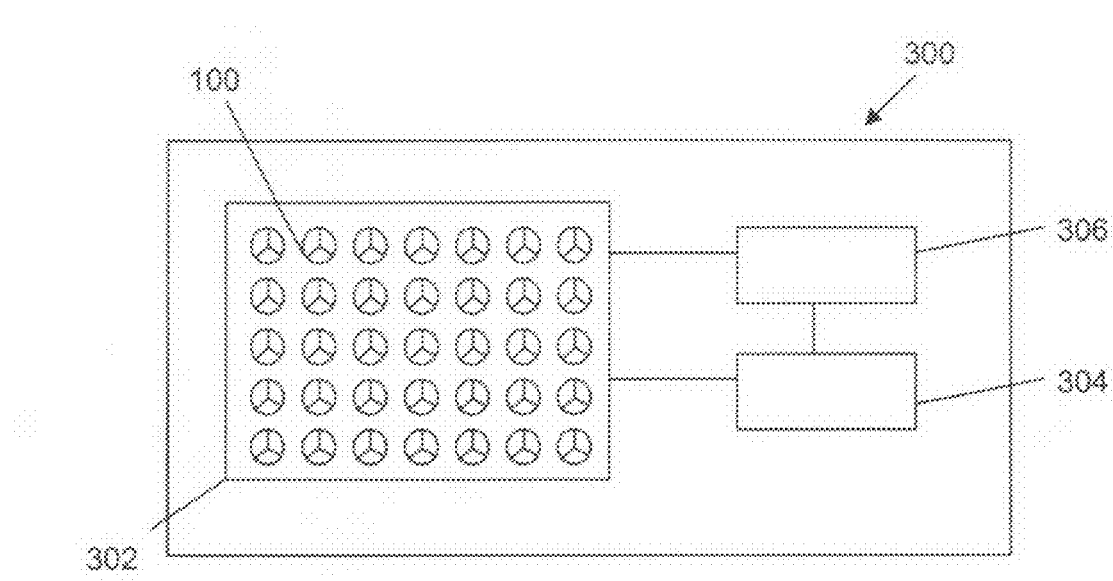
FIG. 5 is a schematic representation of a LED display system comprising LED assemblies, according to a second aspect of the present invention.

In a second aspect, the present invention relates to a light emitting device (LED) display system or lighting system, such as e.g. a light emitting diode (LED) display system or lighting system, wherein the system comprises at least one, but advantageously a plurality of, light emitting device assemblies as described in the first aspect. An exemplary schematic display system is shown by way of illustration in FIG. 5, indicating basic and optional components of the display and/or lighting system according to embodiments of the present invention.

Figure 6:
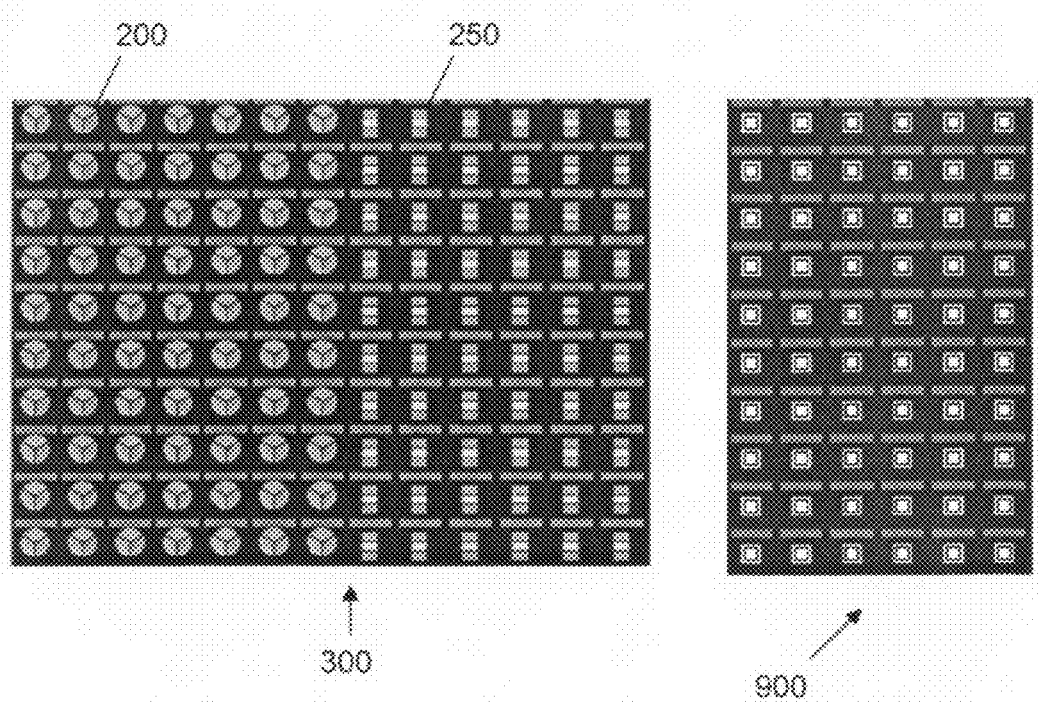
FIG. 6 is a comparison between LED display systems comprising LED assemblies as shown in FIG. 2a respectively FIG. 4a with a LED display system comprising standard LEDs as known from prior art.

The display system 300 may comprise a display panel 302 whereon one or more light emitting device assemblies are positioned. The light emitting device assemblies 100 thereby may comprise the same features and advantages as set out in the first aspect. Advantageously, the display system 300 comprises an array of light emitting device assemblies 100, for example arranged in rows and columns. The display system 300 furthermore may comprise powering connections for the light emitting device assemblies 100, which may be connected to a power supply 304 for powering the light emitting device assemblies. Furthermore, connections to a driver 306 or driving means may be provided for appropriately driving the light emitting devices in the light emitting device assemblies 100, in agreement with image data or lighting data to be provided. Other components, such as e.g. a shader, that often may be present in display systems and known by the person skilled in the art also may be introduced. By way of illustration, a comparison between different display systems 300 having disc-shaped LED assemblies 200 and rectangular LED assemblies 250 according to embodiments according to the present invention on the one hand and convention display systems 900 wherein RGB three-in-one SMD-LEDs are positioned in the panel on the other hand, is shown in FIG. 6. It could be seen that the contrast ratio of the display was significantly lower in case of the three-in-one SMD-LEDs, indicating that at least some embodiments of the present invention have a good contrast ratio.

In a third aspect, the present invention relates to a method for manufacturing a light emitting device assembly. Such a method comprises obtaining a plurality of lamp-type light emitting devices and providing a direct or indirect connection between at least one side wall of a first lamp-type emitting device and at least one side wall of a second lamp-type light emitting device. Obtaining a plurality of lamp-type emitting devices may comprise manufacturing such lamp-type light emitting devices or obtaining such devices in a pre-made form. The shape of the lamp-type light emitting devices or more particularly their encapsulant body thereby may be selected such that the plurality of light emitting devices can be positioned neighboring or adjacent to each other such that they form a compact assembly. Provision of a direct or indirect connection may be performed by providing a connection, e.g. by clicking, clipping, engaging by virtue of shape, gluing, nailing, screwing, etc. In between the different light emitting devices, light separation means, such as for example light blocking means may be provided. The latter may be performed by providing light absorbing or light reflecting material to the surfaces of the light emitting devices, such as for example by applying a film, spraying an optical coating, gluing a separation means to the light emitting devices, etc. Other steps may be provided in agreement with the provision of components of the assembly as described above. For example, shaping and/or finishing of the surface may be performed.

In a fourth aspect, the present invention relates to a method for manufacturing a light emitting device (LED) display system or lighting system. Such a method may comprise obtaining a substrate adapted for supporting a plurality of light emitting device assemblies and providing a plurality of light emitting device assemblies. Providing a plurality of light emitting devices may comprise the different steps as set out in the third aspect, comprising the same features and advantages, the invention not being limited thereto. It is an advantage of embodiments according to the present invention that a compact display can be obtained.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A light emitting device assembly comprising a plurality of lamp-type light emitting devices, each of said lamp-type light emitting devices having a respective individual housing comprising a light output surface and side walls, the lamp-type light emitting devices being positioned adjacent each other, wherein each individual housing is adapted to locate at least one side wall of a light emitting device adjoining to a neighboring light emitting device, and wherein at least two of the plurality of lamp-type light emitting devices are connected to each other via a light separation device separating the light emitted from the light emitting devices.

2. A light emitting device assembly according to claim 1, wherein said plurality of light emitting devices are shaped and positioned such that a cross-section of the light emitting device assembly comprises a substantially disk-shaped light emitting surface.

3. A light emitting device assembly according to claim 2, wherein each of the plurality of light emitting devices comprises a cross-section that corresponds with a sector of the disk-shaped light emitting surface.

4. A light emitting device assembly according to claim 1, wherein each of the plurality of light emitting devices has a rectangular cross-section.

5. A light emitting device assembly according to claim 1, wherein the light separation device is longer than the side walls of the lamp-type light emitting devices.

6. A light emitting device assembly according to claim 5, wherein the light separation device is a light blocking arrangement that blocks crosstalk between the different light emitting devices in the light emitting device assembly.

7. A light emitting device assembly according to claim 6, wherein the light blocking device comprises a reflective or absorbing material.

8. A light emitting device assembly according to claim 7, wherein the light separation device is attachable by a positive attaching arrangement.

9. A light emitting device assembly according to claim 1, wherein the housing comprises a molded encapsulation material.

10. A LED display or lighting system, the system comprising at least one light emitting device assembly according to claim 1.

11. A method for manufacturing a light emitting device assembly, the method comprising
    obtaining a plurality of lamp-type light emitting devices, each of said lamp-type light emitting devices having a respective individual housing comprising a light output surface and side walls and adapted in shape so as to be able to locate at least one side wall of a light emitting device adjoining to a neighboring light emitting device,
    positioning the lamp-type light emitting devices adjacent each other, and
    connecting the at least one side wall of a first lamp-type light emitting device to a first side of a light separation device separating the light emitted from the light emitting devices and connecting the at least one side wall of a second lamp-type light emitting device to a second side of the light separation device.

12. A method according to claim 11, wherein said separation device is a light blocking arrangement.

\* \* \* \* \*